(12) United States Patent
Takahashi

(10) Patent No.: US 7,042,266 B2
(45) Date of Patent: May 9, 2006

(54) DELAY CIRCUIT AND METHOD

(75) Inventor: Hiroyuki Takahashi, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 121 days.

(21) Appl. No.: 09/923,997

(22) Filed: Aug. 7, 2001

(65) Prior Publication Data

US 2002/0021159 A1 Feb. 21, 2002

(30) Foreign Application Priority Data

Aug. 10, 2000 (JP) ............................ P2000-243317
Mar. 29, 2001 (JP) ............................ P2001-097083

(51) Int. Cl.
*H03H 11/26* (2006.01)

(52) U.S. Cl. ...................... 327/288; 327/284

(58) Field of Classification Search ................ 327/283, 327/277, 278, 281, 284, 285, 288, 290, 261, 327/262, 263, 264
See application file for complete search history.

(56) References Cited

U.S. PATENT DOCUMENTS

| | | | | |
|---|---|---|---|---|
| 4,803,665 A | * | 2/1989 | Kasa | 365/233.5 |
| 4,970,694 A | * | 11/1990 | Tanaka et al. | 365/230.06 |
| 5,006,738 A | * | 4/1991 | Usuki et al. | 327/261 |
| 5,055,713 A | * | 10/1991 | Watanabe et al. | 326/27 |
| 5,115,146 A | * | 5/1992 | McClure | 327/143 |
| 5,124,574 A | * | 6/1992 | Ibaraki | 327/548 |
| 5,459,424 A | * | 10/1995 | Hattori | 327/278 |
| 5,672,990 A | * | 9/1997 | Chaw | 327/176 |
| 5,764,090 A | * | 6/1998 | Yeh et al. | 327/174 |
| 5,825,698 A | * | 10/1998 | Kim et al. | 365/200 |
| 5,905,391 A | * | 5/1999 | Mooney | 327/161 |
| 5,929,681 A | * | 7/1999 | Suzuki | 327/284 |
| 6,037,815 A | * | 3/2000 | Togami | 327/172 |
| 6,040,713 A | * | 3/2000 | Porter et al. | 326/17 |
| 6,154,078 A | * | 11/2000 | Stave | 327/261 |
| 6,185,129 B1 | * | 2/2001 | Seo | 365/185.18 |
| 6,414,363 B1 | * | 7/2002 | Mizuguchi | 257/394 |
| 6,492,972 B1 | * | 12/2002 | Kubota et al. | 345/100 |

FOREIGN PATENT DOCUMENTS

| | | | | |
|---|---|---|---|---|
| JP | 06208790 A | * | 7/1994 | |
| KR | 1998-060577 | | 10/1998 | |
| KR | 1998-071343 | | 10/1998 | |

* cited by examiner

*Primary Examiner*—Quan Tra
(74) *Attorney, Agent, or Firm*—Muirhead and Saturnelli, LLC

(57) ABSTRACT

A delay circuit does not lead to excessive increase in the delay time even if the source voltage drops, and enables to control the delay time from increasing. The delay circuit is designed to delay a logic signal SIN having two logic levels consisting of a low level and a high level, such that the delay times are different for the high and low levels, and the circuit chooses either the low level or the high level and targets a logic level having a shorter delay time. That is, n-MOS transistors N11, N12 and p-MOS transistors P11, P12 are provided as MOS capacitors, so as to change from the off-state to the on-state during the transition period of a signal that appears on each node disposed on a delay path of logic signals. Such a circuit design enables to control source-voltage dependence of delay time so that, even if the source voltage drops, delay times are not increased excessively.

6 Claims, 13 Drawing Sheets

DELAY CIRCUIT AND METHOD

BACKGROUND OF THE INVENTION

1. Field of the Invention

The present invention relates to a delay circuit and a method for delaying a logic signal having two logic levels, high and low levels, and relates in particular to a technology for suppressing the dependence of the delay time on source-voltage.

2. Description of the Related Art

Conventionally, in semiconductor apparatuses, delay circuits are used for obtaining timing for signals that are necessary for operating various circuits.

FIG. 16 shows an example of a circuit structure of a delay circuit according to the conventional technology.

The circuit shown in the diagram is constructed by forming an inverter chain using a plurality of inverters JV1~JV4, and connecting an n-MOS transistor JN1~JN4 between the output section of each of the inverter JV1~JV4 and the ground. The gate terminals of the n-MOS transistors JN1~JN4 are connected to the output section of the respective inverters JV1~JV4, and the source and drain of the n-MOS transistors JN1~JN4 are connected to the ground.

According to the delay circuit based on the conventional technology, because the n-MOS transistors JN1~JN4 form MOS capacitors and capacitive loads are connected to each of the inverters, changes in the output signals from each inverter are successively moderated, thereby creating delays in the signal that passes through the delay circuit.

However, from the viewpoints of decreasing voltage resistance caused by microsizing of device structures achieved in recent years, and the desire to lower power consumption, it has become customary to operate internal circuits at low voltages. However, according to the delay circuit in the conventional technology described above, when the source voltage is decreased, delay times are increased excessively relative to the delay times in normal logic circuitries, resulting in a problem that the timing relationships are not satisfied for every signal.

This problem will be explained in detail below.

In semiconductor apparatuses such as DRAMs, address signal lines inside the decoder, for example, are provided over a long distance and such wiring itself exhibits parasitic resistance and parasitic capacitance. FIG. 17 shows such a signal line SL and a driver D (inverter) for driving the signal line. At the forward end of the signal line SL, the input section of a logic gate such as NAND circuit is connected. In this diagram, when sending a signal from the driver D to the logic gate, the driver D drives the parasitic load associated with the signal line SL. In this case, the signal level in the signal line SL varies according to a time constant determined by the parasitic resistance R of the signal line SL, the output resistance of the driver itself (i.e., on-resistance of the driving transistor) and the parasitic capacitance C of the signal line SL.

Here, although the on-resistance of the driving transistor comprising the driver D exhibits source-voltage dependency, and increases in proportion to the square of the source voltage when the source voltage drops, the parasitic resistance of the signal line does not exhibit source-voltage dependency. Generally, therefore, for those circuitries in which parasitic resistance of wiring represents the load, delay time for signals shows a tendency not to depend extensively on the source voltage.

In contrast, in the case of the delay circuit shown in FIG. 16, because the wiring connected to the output section of each inverter is short, wiring resistance does not exist in essence, resulting that the resistance component, that includes the MOS capacitance and contributes to the time constant, is dominated by the on-resistance of the transistor comprising each inverter. For this reason, as shown in FIG. 18, the conventional delay circuits exhibit higher source-voltage dependency compared with ordinary logic circuits so that the delay times become excessive as the source voltage drops. The result is a shift in timing between the signal transmitted through the internal logic circuits and the signal transmitted through the delay circuit, which can lead to occasional erroneous operation of those circuits that depend on timely receiving of such signals.

SUMMARY OF THE INVENTION

The present invention is provided in view of the background situation described above, and it is an object of the present invention to provide a delay circuit and a method of delaying logic signals that do not lead to excessive increase in the delay time even if the source voltage drops, so as to enable to control the delay time from increasing.

To resolve the problems described above, the present invention provides the following structure of the delay circuit.

That is, the delay circuit for delaying a logic signal has two logic levels consisting of a low level and a high level, is comprised by an inverter chain containing one inverter or not less than two inverters; and a metal-oxide-semiconductor capacitor, known as a MOS capacitor, connected to an output section of the inverter and, when a logic signal having a targeted logic level is input, changes from an off-state to an on-state during a transition period of a signal that appears in the output section of the inverter.

A delay circuit of the present invention for delaying a logic signal having two logic levels consisting of a low level and a high level, is comprised by an inverter chain containing one inverter or not less than two inverters; and a metal-oxide-semiconductor capacitor, known as a MOS capacitor, connected to an output section of the inverter and exhibiting changes in its capacitance to correspond with changes in output resistance of the inverter in relation to a source voltage.

In the delay circuit, a ratio of a gate voltage range of an on-state MOS capacitor to a gate voltage range of an off-state MOS capacitor is proportional to an increment or a decrement of the source voltage during a transition period of a signal that appears in the output section of the inverter.

In the delay circuit, a value of the MOS capacitor changes in a direction to increase its capacitance during a transition period of a signal that appears in the output section of the inverter.

In the delay circuit, the MOS capacitor is a node disposed on a transmission path of a logic signal, and is represented by an n-MOS transistor whose gate is connected to a node that changes a logic level of the logic signal from a low level to a high level, and whose source and whose drain are fixed at a ground potential.

In the delay circuit, the MOS capacitor is, for example, a node disposed on a transmission path of a logic signal, and is represented by a p-MOS transistor whose gate is connected to a node that changes a logic level of the logic signal from a high level to a low level, and whose source and drain are fixed at a ground potential.

In the delay circuit, the MOS capacitor is, for example, a node disposed on a transmission path of a logic signal, and is represented by an n-MOS transistor whose source and drain are connected to a node that changes a logic level of the logic signal from a high level to a low level, and whose gate is fixed at a source voltage.

In the delay circuit, the MOS capacitor is, for example, a node disposed on a transmission path of a logic signal, and is represented by a p-MOS transistor whose source and drain are connected to a node that changes a logic level of the logic signal from a high level to a low level, and whose gate is fixed at a ground potential.

In a delay circuit of the present invention for delaying a logic signal having two logic levels consisting of a low level and a high level, is comprised by: an inverter chain containing one inverter or not less than two inverters; and a p-channel metal-oxide-semiconductor transistor and an n-channel metal-oxide-semiconductor transistor, known as MOS transistors, to comprise the inverter, wherein a gate threshold voltage of each gate is shifted in mutually opposing directions.

The method of the present invention for delaying a logic signal having two logic levels consisting of a low level and a high level, comprises the steps of: (a) setting a metal-oxide-semiconductor capacitor disposed on a transmission path of a logic signal to an off-state in an initial stage; and (b) changing the metal-oxide-semiconductor capacitor to an on-state from the off-state according to a logic level of the logic signal.

In the delay method, the metal-oxide-semiconductor capacitor changes its capacitance in a direction of increasing values, during a transition period of a signal that appears on a node connected to the metal-oxide-semiconductor capacitor and disposed on a transmission path of a logic signal.

According to the present invention, the following benefits are gained.

That is, in the present delay circuit that delays a logic signal having two logic levels consisting of a low level and a high level, because the delay circuit is designed in such a way that the delay times are different for the high and low levels and the delay circuitry targets a logic level having a shorter delay time as the delay target, the delay time is not increased excessively even if the source voltage drops, thereby suppressing the delay time from increasing.

DESCRIPTION OF THE PREFERRED EMBODIMENTS

Preferred embodiments will be explained in the following with reference to the drawings.

Embodiment 1

Figure 1A:
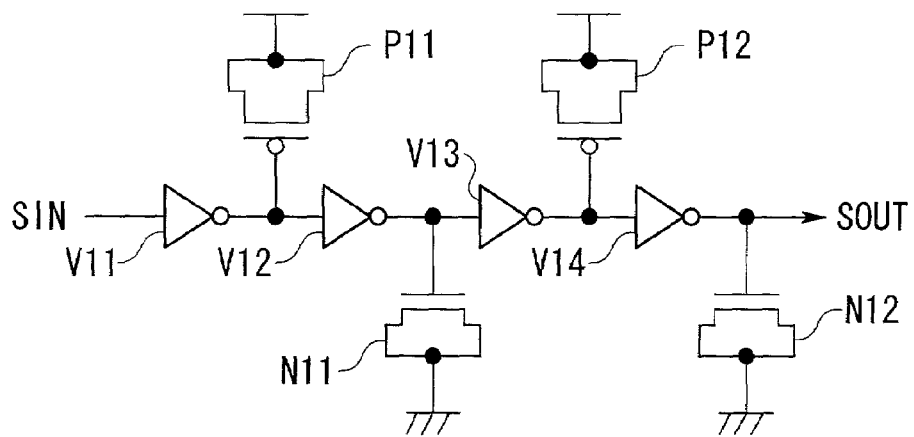
FIG. 1A, 1B are circuit diagrams to show the structures of delay circuits in Embodiment 1 of the present invention.

FIG. 1A shows a delay circuit in Embodiment 1.

This delay circuit is designed to output signal OUT by delaying a logic signal SIN that has two logic levels consisting of low level and high level, and exhibits a characteristic that the delay time for a logic signal input at the high level is different than a logic signal input at the low level, so that the delay circuit is comprised of a delaying system such that, of the two logic levels (low and high logic levels) given as the logic levels of the logic signal SIN, the logic level targeted for delay is the one having a shorter delay time. In the example shown in the diagram, the high level of the logic signal SIN is the delay target so that the logic signal SIN is delayed when the logic signal SIN changes from the low level to the high level.

The structure of the delay circuit will be explained in the following.

As shown in FIG. 1A, this delay circuit is comprised by an inverter chain that includes inverters V11~V14; p-MOS transistors P11, P12; and n-MOS transistors Nil, N12. Inverters V11~V14 are MOS devices comprised by p-MOS transistors and n-MOS transistors. Specifically, the source of each p-MOS transistor and n-MOS transistor that comprise each inverter is connected, respectively, to the power source and the ground, and each gate is connected in common to serve as the input section of the inverter, and each drain is connected in common to serve as the output section of the inverter.

Also, p-MOS transistors P11, P12 are connected to the output section of the inverters V11, V13, respectively, and when a logic signal having a logic level targeted for delay is input, act as the MOS capacitor that changes from the off-state to the on-state in the transition period of the signal that appears in the output section of the inverters V11, V13. Specifically, the gate of the p-MOS transistor P11 is connected to the output section of the inverter V11, and its source and drain are connected to the power source. The gate of p-MOS transistor P11 is connected to the output section of the inverter V13, and its source and drain are connected to the power source.

Also, the n-MOS transistors N11, N12 are connected respectively to the output section of the inverters V12, V14, and when a logic signal having the logic level targeted for delay is input, acts as the MOS capacitor that changes from the off-state to the on-state in the transition period of the signal that appears in the output section of the inverters V12, V14. Specifically, the gate of the n-MOS transistor N11 is connected to the output section of the inverter V12, and its source and drain are connected to the ground. The gate of n-MOS transistor N11 is connected to the output section of the inverter V14, and its source and drain are connected to the ground.

Accordingly, p-MOS transistors P11, P12 form MOS capacitors, whose gate is connected to a node situated on the transmission path of a logic signal SIN, where the logic level of the logic signal SIN changes from the high level to the low level, and similarly, n-MOS transistors N11, N12 form MOS capacitors, whose gate is connected to a node situated on the transmission path of the logic signal SIN, where the logic level of the logic signal SIN changes from the low level to the high level. That is, in Embodiment 1, when the delay target high level is input as the logic signal SIN, a MOS capacitor comprised by the p-MOS transistor is provided for the output section of the inverter, where the output signal changes from the high level to the low level, and a MOS capacitor comprised by the n-MOS transistor is provided for the output section of the inverter, where the output signal changes from the low level to the high level Here, the threshold gate voltages Vt of the p-MOS transistors P11, P12 and the n-MOS transistors N11, N12 that form MOS capacitors are set higher than the threshold gate voltage of ordinary transistors. In the following, when it is specified as "high-Vt" in the present invention, it means the threshold gate voltage Vt is set higher than standard gate threshold voltage, and when it is specified as "low-Vt", it means that the threshold gate voltage Vt is set at the standard threshold gate voltage. However, the meaning of "high-Vt and low-Vt" is not limited to such interpretations, and may be applied to any two types of threshold gate voltages that can be related by their relative magnitudes.

Figure 1B:
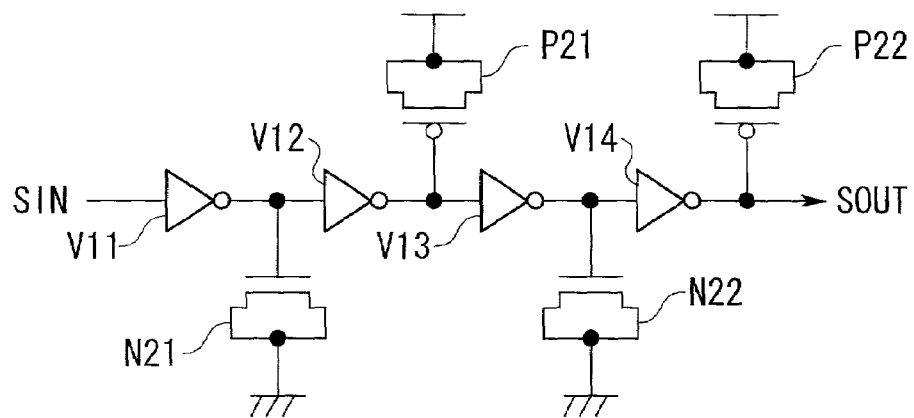

Further, in Embodiment 1, the high level of the logic signal SIN is selected as the delay target, but if the low level is to be selected as the delay target, the structure shown in FIG. 1B should be used. That is, in this case, p-MOS transistors P11, P12 in the structure shown in FIG. 1A, are replaced by n-MOS transistors N21, N22, and n-MOS transistors N11, N12 are replaced by p-MOS transistors P21, P22.

In this case, p-MOS transistors P21, P22 are connected to the output section of the inverters V11, V13, respectively, and when a logic signal having the logic level (high level) for delay target is input, act as an MOS capacitor that changes from the off-state to the on-state in the transition period of the signal that appears in the output section of the inverters V11, V13. N-MOS transistors N21, N22 are connected to the output section of the inverters V12, V14, respectively, and when a logic signal having the logic level (high level) for delay target is input, act as an MOS capacitor that changes from the off-state to the on-state in the transition period of the signal that appears in the output section of the inverters V12, V14.

In the following, the operation (a method for delaying logic signals) of the delay circuit in Embodiment 1 will be explained with reference to FIG. 1A.

In the initial stage, the logic level of the logic signal SIN is assumed to be at the low level. In this case, output signal from the inverters V11, V13 is at the high level, and the output signal from the inverters V12, V14 is at the low level. Therefore, the MOS capacitors connected in the transmission path of the logic signals, i.e., p-MOS transistors P11, P12 and n-MOS transistors N11, N12 are in the off-state.

Here, in the present invention, it is to be understood that the statement "MOS capacitor is in the off-state" means that a channel is not formed in the MOS transistor that comprises a MOS capacitor, and the statement "MOS capacitor is in the on-state" means that a channel is formed in the transistor that comprises a MOS capacitor.

Next, when the logic signal SIN changes from the low level to the high level at a given timing, the inverters V11~V14 respond by successively changing their output signals. Then, p-MOS transistor P11, n-MOS transistor N11, p-MOS transistor P12, n-MOS transistor N12 which were in the off-state in the initial stage change from the off-state to the on-state. That is, p-MOS transistors P11, P12 and n-MOS transistors N11, N12 that function as MOS capacitors change successively from the off-state to the on-state.

Because channels are not formed in the P-MOS transistors P11, P12 and in the n-MOS transistors N11, N12 that function as MOS capacitors, values of the MOS capacitors are low; however, in the on-state, channels are formed so that the values of the MOS capacitors increase. Therefore, the capacitance values of the p-MOS transistors P11, P12 and n-MOS transistors N11, N12 that comprise the MOS capacitors change in the direction of increasing capacitance in the transition period of the signals that appear in the output section of the inverters V11~V14.

In this case, because p-MOS transistors P11, P12 and n-MOS transistors N11, N12 are in the off-state in the initial stage, delay times input in the logic signals SIN are shorter relative to the case of the MOS capacitor being in the on-state in the initial stage. In other words, this delay circuit has a characteristic that delays a logic signal SIN by differing amounts at the high or low level by shortening the delay time of the logic signal SIN. However, the amount of reduction in delay time is limited by the delay time required by a high-level target logic signal. By adopting such an approach to delaying, the delay times input in the target logic level are contained effectively, and the source-voltage dependency of the delay time is controlled.

In Embodiment 1, MOS capacitor is changed from the off-state to the on-state in the transition period of the target logic signal in a direction of increasing the value of MOS capacitor, but from another perspective, p-MOS transistors P11, P12 and n-MOS transistors N11, N12 that function as MOS capacitors can be said to behave in such a way that the capacitance values change in response to the changes in the output resistances of the inverters V11~V14 in association with the source voltage. For example, if the source voltage decreases to cause a reduction in the driving current of a transistor and an increase in apparent on-resistance, a value of the MOS capacitor is reduced relatively and an increase in the delay time is contained.

From still another viewpoint, in the transition period of the signals appearing in the output section of individual inverters that comprise the delay circuit, a ratio of the gate voltage range whose MOS capacitor is in the on-state to the gate voltage range whose MOS capacitor in the off-state can be said to be proportional to the increment or decrement of the source voltage. For example, taking a specific example of the n-MOS transistor N11 shown in FIG. 1A, a gate voltage range of the on-state n-MOS transistor N11 refers to a gate voltage range from the threshold gate voltage Vt of the n-MOS transistor N11 to the source voltage, and a gate voltage range of the off-state n-MOS transistor N11 refers to a gate voltage range from the ground voltage to the threshold gate voltage Vt of the n-MOS transistor N11.

Here, because the threshold gate voltage Vt is constant in relation to the source voltage, the gate voltage range of the off-state n-MOS transistor N11 is constant in relation to fluctuations in the source voltage. In contrast, the gate voltage range of the on-state n-MOS transistor N11 changes by an amount equal to a change in source voltage. The result is that the ratio of the gate voltage range of an on-state MOS capacitor to the gate voltage range of an off-state MOS capacitor becomes proportional to incremental or decremental change in the source voltage.

As explained above, according to Embodiment 1, because the MOS capacitors are set to the off-state in the initial stage and are made to change to the on-state based on a target logic signal, it is not only possible to obtain a required delay time but to contain the source-voltage dependency of the delay time. Therefore, even if the source voltage decreases, delay times are not excessively increased, and it enables to match the delay characteristics of a delay circuit (i.e., dependency on the source voltage) and the delay characteristics of the logic circuits that drive the wiring load. Thus, it enables to maintain stable timing of signals transmitted through the delay circuit and other logic circuits, thereby preventing erroneous actions of circuits that operate by receiving such signals.

Embodiment 2

Embodiment 2 will be explained in the following.

FIG. 2 shows a structure of a delay circuit in Embodiment 2.

In Embodiment 1 described above, the delay circuit depends on a MOS capacitor comprised by a p-MOS transistor in the output section of an inverter whose output signal changes from the high level to the low level according to the nature of a logic signal SIN, and on an n-MOS capacitor comprised by an n-MOS transistor in the output section of an inverter whose output signal changes from the low level to the high level, but in Embodiment 2, an MOS capacitor is provided in either the output section of an inverter whose output signal changes from the high level to the low level or the output section of an inverter whose output signal changes from the low level to the high level according to the nature of a logic signal SIN.

FIG. 2 shows an example of the structure of the delay circuit in Embodiment 2.

Figure 2A:
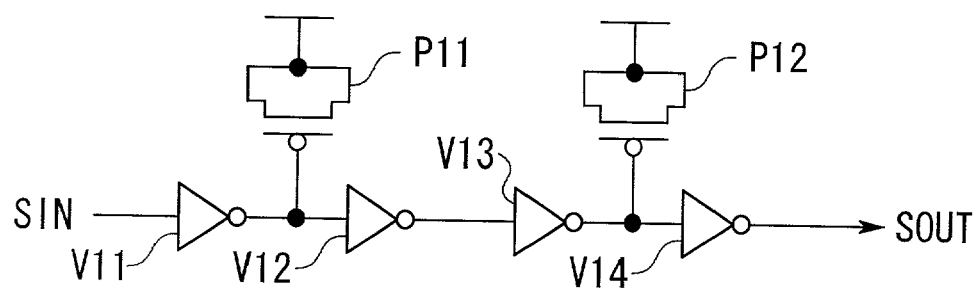
FIG. 2A, 2B are circuit diagrams to show the structures of delay circuits in Embodiment 2 of the present invention.

The example shown in FIG. 2A, n-MOS transistors N11, N12 serving as MOS capacitors shown in FIG. 1A are eliminated, and high-Vt p-MOS transistors P11, P12 only are used.

According to this structure, when the output signal from the inverters V11, V13 changes from the high level to the low level, p-MOS transistors P11, P12 change from the off-state to the on-state, and values of the MOS capacitors change in the direction of increasing value in the transition period of the output signal from the inverters. Therefore, a delay circuit having less dependency on the source voltage has been realized using only p-MOS transistors as MOS capacitors, and, furthermore, the circuit configuration can be made simpler compared with the structure shown in FIG. 1A.

Figure 2B:
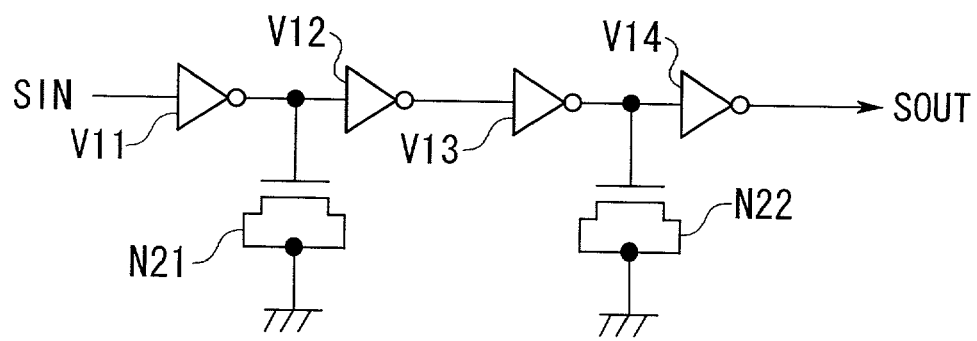

In the example shown in FIG. 2B, p-MOS transistors P11, P12 serving as MOS capacitors shown in FIG. 1A are eliminated, and only n-MOS transistors N21, N22 of high-Vt are used.

According to this structure, when the output signal from the inverters V11, V13 changes from the low level to the high level, n-MOS transistors N21, N22 change from the off-state to the on-state, and in the transition period of the output signal from the inverters, values of the MOS capacitors change in the direction of increasing value. Therefore, a delay circuit having less dependency on the source voltage has been realized using only N-MOS transistors as MOS capacitors, and, furthermore, the circuit configuration can be made simpler compared with the structure shown in FIG. 1B.

Embodiment 3

Embodiment 3 will be explained in the following.

Figure 3:
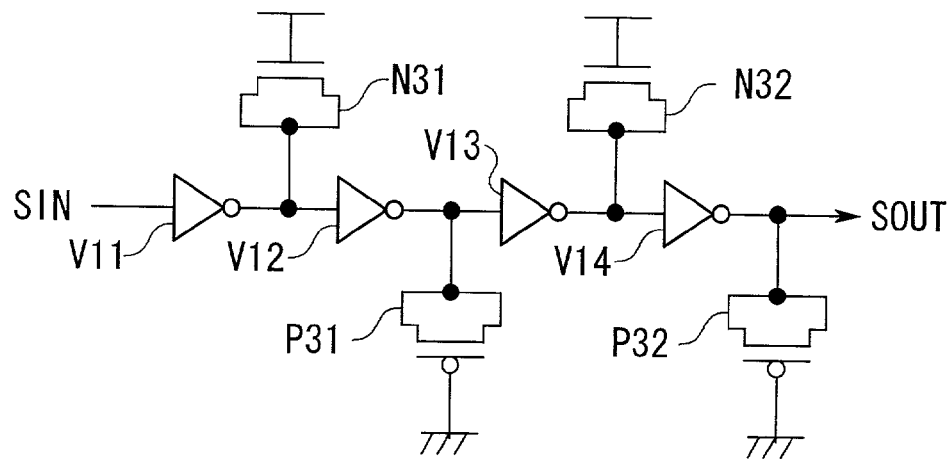
FIG. 3 is a circuit diagram to show the structures of delay circuits in Embodiment 3 of the present invention.

FIG. 3 shows a structure of a delay circuit in Embodiment 3.

In the example shown in the diagram, p-MOS transistors P11, P12 shown in FIG. 1A to serve as the MOS capacitors are replaced with n-MOS transistors N31, N32 of high-Vt, and n-MOS transistors N11, N12 are replaced with p-MOS transistors 31, P32 of high-Vt.

Here, the drain and source of n-MOS transistors N31 are connected in common to the output section of the inverter V11, and the drain and source of n-MOS transistor N32 are connected to the output section of the inverter V13, and the gate terminals of n-MOS transistors N31, N32 are both fixed at the source voltage VDD. Also, the drain and source of p-MOS transistor P31 are connected to the output section of the inverter V12, and the drain and source of p-MOS transistor P32 are connected to the output section of the inverter V14, and the gate terminals of the p-MOS transistors P31, P32 are both fixed at the source voltage VDD. That is, the source and drain of an n-MOS transistor to serve as a MOS capacitor are connected to a node situated on the transmission path of a logic signal SIN, where the logic level of a logic signal SIN changes from the high level to the low level, and the gate is fixed at the source voltage. Similarly, the source and drain of a p-MOS transistor to serve as a MOS capacitor are connected to a node situated on the transmission path of a logic signal SIN, where the logic level of the logic signal SIN changes from the low level to the high level, and the gate is fixed to the ground.

According to this structure, when the output signal from the inverters V11, V13 changes from the high level to the low level, n-MOS transistors N31, N32 change from the off-state to the on-state, and a value of the MOS capacitor changes in the direction of increasing value in the transition period of the output signal from the inverters. Also, when the output signal from the inverters V12, V14 changes from the low level to the high level, p-MOS transistors P31, P32 change from the off-state to the on-state, and a value of the MOS capacitor changes in the direction of increasing value in the transition period of the output signal from the inverters. Therefore, similar to the case of the delay circuit shown in FIG. 1A in Embodiment 1, it enables to realize a delay circuit having small dependency on the source voltage.

Further, in line with the correlating structures shown in FIG. 1A and 3, the p-MOS transistors P21, P22 and the n-MOS transistors N21, N22 shown in FIG. 1B may be replaced with the n-MOS transistors N31, N32 and the p-MOS transistors P31, P32 shown in FIG. 3B. Also, though not explained especially, MOS transistors may be used that have the source and drain connected to the output section of each inverter and the gate is fixed at the source voltage or ground potential may be used to serve as MOS capacitors.

Embodiment 4

Embodiment 4 will be explained in the following.

Figure 4:
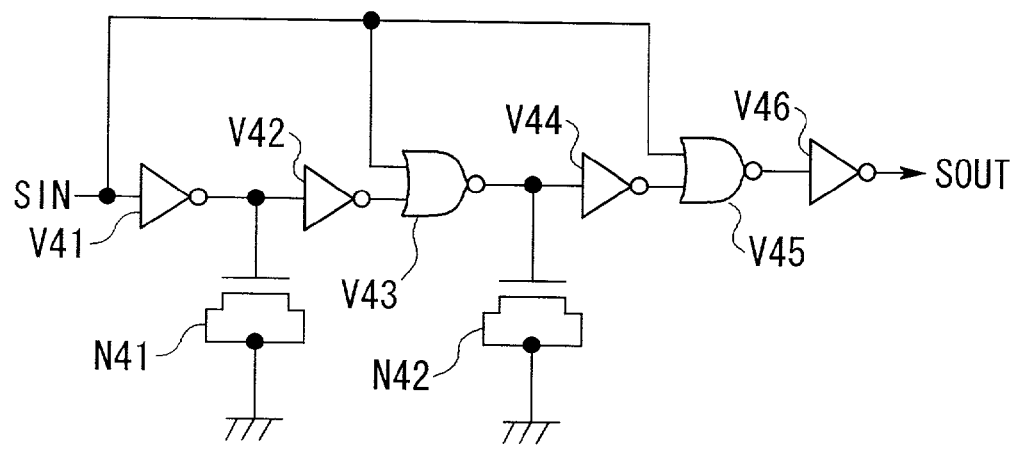
FIG. 4 is a circuit diagram to show the structure of a delay circuit in Embodiment 4 of the present invention.

FIG. 4 shows a structure of a delay circuit in Embodiment 4.

This delay circuit is derived from the delay circuit shown in FIG. 2B, and by providing NOR-gates V43, V45 on the transmission path of the delay circuit, the circuit is designed so that, when the logic signal reverts to the high level, the internal state of the delay circuit is returned rapidly to the original state.

In the diagram shown, the inverters V41, V42 and the n-MOS transistor N41 of high-Vt construct a delay path based on the same concept illustrated in FIG. 2B, and the delay circuit operates by delaying a logic signal SIN and inputting the signal into one input section of the NOR-gate 43. The other input section of the NOR-gate 43 receives the logic signal SIN directly. The NOR-gate 43, n-MOS transistor N42 of high-Vt and the inverter V44 also construct a delay circuit based on the concept illustrated in FIG. 2B, and the delay circuit operates by delaying a logic signal SIN and inputting the signal into one input section of the NOR-gate 45. The other input section of the NOR-gate 45 receives the logic signal SIN directly. The output signal from the NOR-gate 45 is input in the inverter V46 and is output as signal SOUT.

In Embodiment 4, the logic signal SIN is at the high level in the initial stage, and when the logic signal changes from this state to the low level, this logic signal SIN transmits through the delay circuit comprised by the inverter 41, n-MOS transistor N41 and inverter V42, and through the delay circuit comprised by the NOR-gate V43, n-MOS transistor N42 and inverter V44, and is input in the NOR-gate V45, and transmits through the NOR-gate V45 and the inverter V46 to be output as signal SOUT. In this manner, the logic signal SIN is delayed and is output as signal SOUT.

In contrast, when the logic signal SIN changes from the low level to the high level, the output signal from the NOR-gates V43, V45 is forced to the low level, and the internal state of the delay circuit is quickly reverted to the initial state.

Therefore, according to Embodiment 4, the delay circuit enables to delay a target logic signal SIN at the low level effectively while containing the source-voltage dependency, and further, to quickly prepare for the next low level logic signal SIN.

Embodiment 5

Embodiment 5 will be explained in the following.

Figure 5:
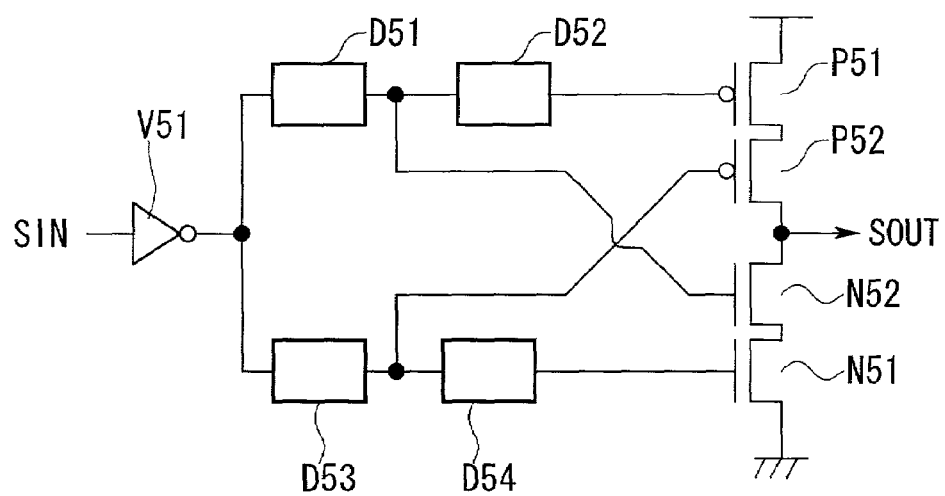
FIG. 5 is a circuit diagram to show the structure of a delay circuit in Embodiment 5 of the present invention.

FIG. 5 shows a structure of a delay circuit in Embodiment 5.

Embodiments 1 to 4 presented above are designed to target either the low level or the high level as the delay target, but the delay circuit in Embodiment 5 is designed to delay signals of both high and low levels.

The delay circuit shown in FIG. 5 is comprised by an inverter V51 for inputting a logic signal SIN; delay systems D51, D52 for delaying low level signals; delay systems D53, 54 for delaying high level signals; p-MOS transistors P51, 52; and n-MOS transistors N51, 52. The delay systems D51, 52 have the same structure as that shown in FIG. 1B, and the delay systems D53, 54 have the same structure as that shown in FIG. 1A.

The structure will be explained specifically.

The output section of the inverter V51 is connected to the input section of the delay system D51, and the output section of the delay system D51 is connected to the input section of the delay system D52. Also, the output section of the inverter V51 is connected to the input section of the delay system D53, and the output section of the delay system D53 is connected to the input section of the delay system D54. The source of the p-MOS transistor P51 is connected to the power source, and the gate is connected to the output section of the delay system D52. The source of the p-MOS transistor P52 is connected to the drain of the p-MOS transistor P51, and the gate is connected to the output section of the delay system D53. The source of the n-MOS transistor N52 is connected to the ground, and the gate is connected to the output section of the delay system D54. The source of the n-MOS transistor N52 is connected to the drain of the n-MOS transistor N51, and the gate is connected to the output section of the delay system D51. The junction point of the drain of the p-MOS transistor P52 and the drain of the n-MOS transistor N52 serve as the output section of this delay circuit.

Next, the operation of the delay circuit in Embodiment 5 will be explained.

When a logic signal SIN changes from the low level to the high level, the output signal from the inverter V51 changes from the high level to the low level. The output signal from the inverter V51 is delayed by the delay system D51 and is input in the gate of the n-MOS transistor N52 to switch the n-MOS transistor N52 to the off-state, and is delayed further by the delay system D52 and is input in the gate of the p-MOS transistor P51 to switch the p-MOS transistor P51 to the on-state. In the meantime, the output signal from the inverter V51 is delayed by the delay system D53 and is input in the gate of the p-MOS transistor P52 to switch the p-MOS transistor P52 to the on-state, and is delayed further by the delay system D54 and is input in the gate of the n-MOS transistor N51 to switch the n-MOS transistor N51 to the off-state.

Here, focusing the attention on the respective operations of the p-MOS transistors P11, P12 and the n-MOS transistors N51, N52, in the process of controlling the p-MOS transistor P51 to attain the on-state, p-MOS transistor P52 and n-MOS transistors N52 are controlled first to attain, respectively, the on-state and off-state. Therefore, the signal SOUT transmits through the delay systems D51, D52 and attains high level based on the signal input in the p-MOS transistors P51. That is, the low level output from the inverter V51 is delayed by the delay systems D51, D52, and, based on the signal delayed by the delay systems D51, D52, the signal SOUT attains the high level.

Similar to the case described above, when the logic signal SIN changes from the high level to the low level, the high level output from the inverter V51 is delayed by the delay systems D53, D54, and based on the signal delayed by the delay systems D53, D54, the signal SOUT becomes low level.

According to Embodiment 5, because a delay path targeting the low level and a delay path targeting the high level are provided, it enables to process signal changes that involve a low to high level change as well as a high to low level change.

Embodiment 6

Embodiment 6 will be explained in the following.

The delay circuits described in Embodiments 1 to 5 are used to simply delay the logic level of logic signals, but in Embodiment 6, the circuit is constructed as a pulse generation circuit to generate one-shot pulses.

Figure 6:
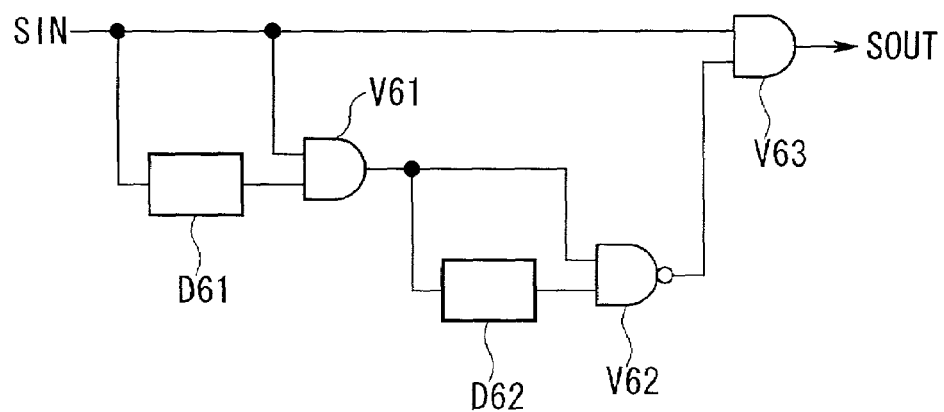
FIG. 6 is a circuit diagram to show the structure of a delay circuit in Embodiment 6 of the present invention.

FIG. 6 shows the structure of a pulse generation circuit constructed using a delay circuit provided in Embodiment 6. The pulse generation circuit shown in the diagram is comprised by a delay system D61; an AND-gate V61; a delay system D62; a NAND-gate V62; and an AND-gate V63. In this circuit, the delay systems D61, D62 have the same structure as the circuit shown in FIG. 1A.

The structure will be explained specifically.

A logic signal SIN is input in the input section of the delay system D61. One input section of the AND-gate V61 is connected to the output section of the delay system D61, and the other input section is given the logic signal SIN. One input section of the NAND-gate V62 is connected to the output section of the delay system D62, and the other input section is connected to the output section of the AND-gate V61. One input section of the AND-gate V63 is connected to the output section of the NAND-gate V62, and the other input section is given the logic signal SIN directly.

Next, the operation of the circuit in Embodiment 6 will be explained.

It is assumed that the logic signal SIN is set to the low level, in the initial stage. In the initial stage, the signal given from the NAND-gate V61 to the AND-gate V63 is set to the low level and the signal SOUT is at the low level. When the logic signal SIN in this state changes from the low level to the high level, AND-gate 63 responds and sets the signal SOUT to the high level. And, the high level of the logic signal SIN is delayed by the delay system D61 and is input in one input section of the AND-gate V61. At this time, because the logic signal SIN given directly to the other input section of the AND-gate V61 is already at the high level, the output signal from the AND-gate V61 changes to the high level based on the signal transmitted through the delay system D61.

The output signal from the AND-gate V61 is delayed by the delay system D62 and is input in one input section of the NAND-gate V62. At this time, because the logic signal SIN given from the AND-gate V61 to the other input section of the NAND-gate V62 is already at the high level, the output signal from the NAND-gate V62 changes to the low level based on the signal transmitted through the delay system D62. The AND-gate V63 receives the output signal from the NAND-gate V62 and sets the signal SOUT to the low level. The result is that, when the logic signal SIN changes from the low level to the high level, the output signal SOUT is a one-shot pulse signal having a pulse width corresponding to the delay time through the delay system D62.

According to Embodiment 6, when the logic signal SIN changes from the low level to the high level, a one-shot pulse having a pulse width of controlled source-voltage dependency can be generated. Therefore, even if the source-voltage decreases, the pulse width can be maintained essentially constant.

Embodiment 7

Embodiment 7 will be explained in the following.

In the examples presented in Embodiment 1~6, biasing method for the substrate of the MOS transistor that comprises MOS capacitor has not been described in particular, but according to normal biasing method, the substrate (or the well) of an n-MOS transistor to function as a MOS capacitor is biased at the ground potential, and the substrate (or the well) of a p-MOS transistor is biased at the source voltage.

In contrast, in Embodiment 7, by increasing the biasing voltage of the substrate of the MOS transistor that comprises a MOS capacitor to utilize the substrate effects, the apparent gate threshold voltage is increased.

Figure 7:
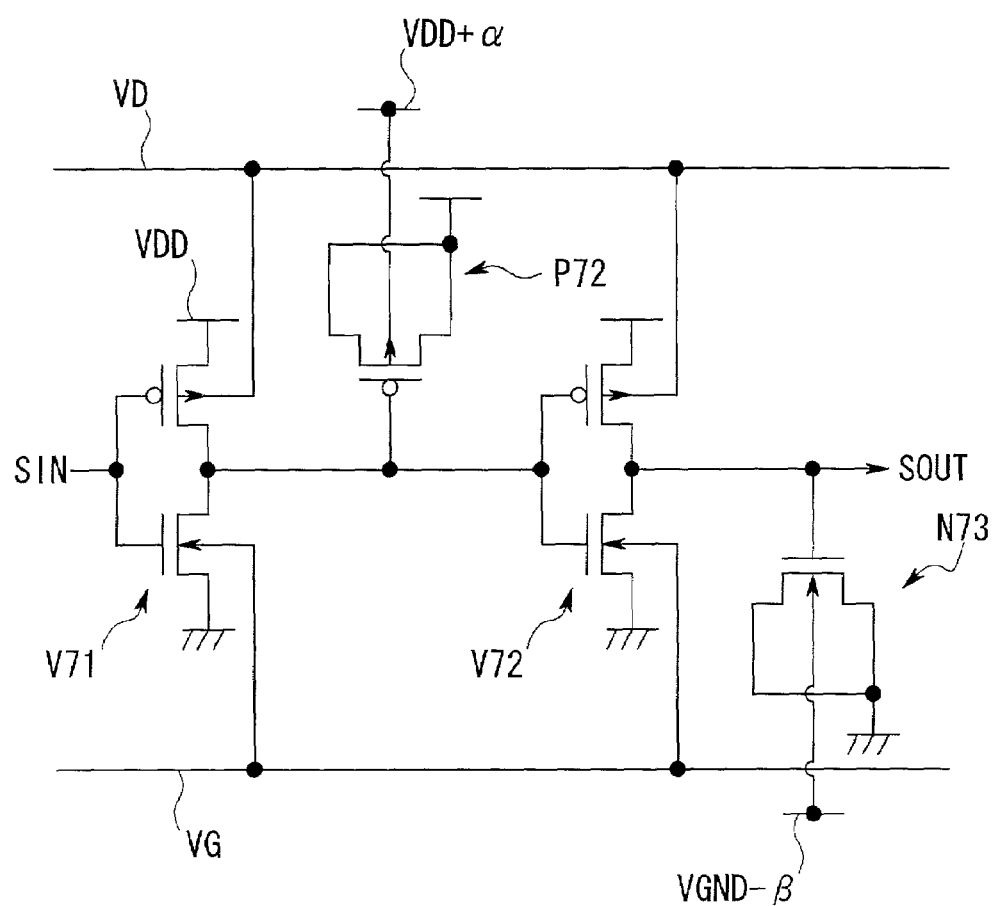
FIG. 7 is a circuit diagram to show the structure of a delay circuit in Embodiment 7 of the present invention.

FIG. 7 shows characteristic sections of the delay circuit in Embodiment 7.

In this diagram, inverters V71, V72 correspond, for example, to inverters V11, V12 shown in FIG. 1A described earlier, and p-MOS transistor P72 and n-MOS transistor N73 that function as MOS capacitors correspond to p-MOS transistor P11 and n-MOS transistor N11. However, the substrate (or the well) of the p-MOS transistor P72 in this embodiment is biased higher than the source voltage VDD by an amount $\alpha$ to a voltage [VDD+$\alpha$], and the substrate (or the well) of the n-MOS transistor N73 is biased lower than the ground potential VGND by an amount $\beta$ to a voltage [VDD−$\beta$]. The constants $\alpha$ and $\beta$ represent the amount of biasing applied on the substrate, and are selected according to the gate threshold voltages of required MOS capacitors.

The substrate of p-MOS transistors that comprise inverters V71, V72 is biased at a voltage VD, and the substrate of n-MOS transistor is biased at a voltage VG. Here, the voltage VG is at a source voltage VDD when the semiconductor apparatus equipped with the present delay circuit is active, and during the standby period, it is at a value [VDD+$\alpha$]. Also, the voltage VG is at the ground potential VGND when active, and is at a value [VGND−$\beta$] when on standby.

According to Embodiment 7, by controlling the biasing amount of the substrate of MOS capacitor, the gate threshold voltage of a MOS transistor that comprises a MOS capacitor can be set to a suitable value. Therefore, there is no need to prepare two kinds of gate threshold voltages as basic characteristics of a device itself.

Embodiment 8

Embodiment 8 will be explained in the following.

In the embodiments presented in Embodiments 1~7, delay circuits are constructed using MOS capacitors so that delay times are different for high and low levels; however, in Embodiment 8, the delay times at high and low levels are made different by selecting either high-Vt or low-Vt for the gate threshold voltage of a p-MOS transistor and an n-MOS transistor that comprise an inverter in the delay circuit.

Figure 8A:
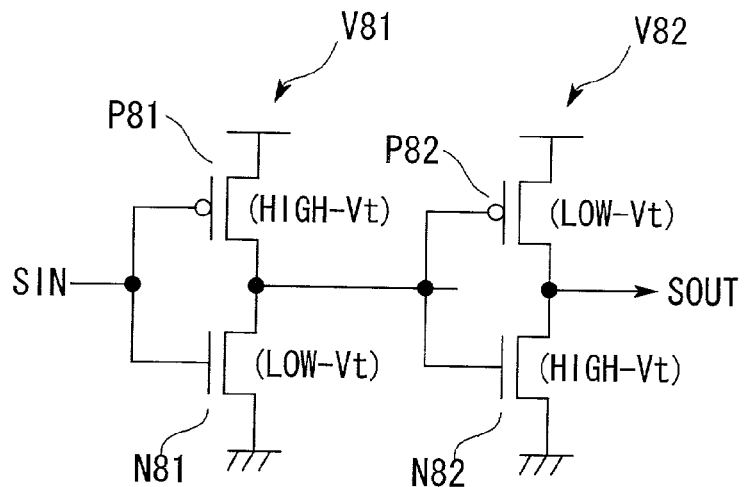
FIG. 8A is a circuit diagram to show the structure of a delay circuit in Embodiment 8 of the present invention.

FIG. 8A shows characteristic sections of the structure of the delay circuit in Embodiment 8.

As shown in the diagram, the delay circuit targets the high level of the logic signal SIN, and is comprised by an inverter chain having an inverter V81 in series with an inverter V82. Here, in accordance with the logic level of a target logic signal, the gate threshold voltages of the p-MOS transistor and the n-MOS transistor comprising the respective inverters are shifted in opposite directions with respect to standard gate threshold voltage. Specifically, the gate threshold voltage of the p-MOS transistor P81 comprising the inverter V81 is set to a high-Vt, and the gate threshold voltage of the n-MOS transistor N81 is set to a low-Vt. Also, the gate threshold voltage of a p-MOS transistor P82, comprising the inverter V82 connected to the backstage, is set to a low-Vt, and the gate threshold voltage of a n-MOS transistor N82 is set to a high-Vt. By so doing, the input threshold value of the forestage inverter V81 is set low while the input threshold value of the rearstage inverter V82 is set high.

Further, although the high level logic signal is chosen as the delay target in this embodiment, if it is desired to target the low level logic signal, then the forestage inverter V81 may be comprised by a p-MOS transistor P81 whose gate threshold voltage is set to a low-Vt, and by an n-MOS transistor N81 whose gate threshold voltage is set to a high-Vt, and also, the backstage inverter V82 connected to the backstage may be comprised by a p-MOS transistor P82 whose gate is set to a high-Vt and the gate threshold voltage of an n-MOS transistor N82 whose gate threshold voltage is set to a low-Vt.

Figure 8B:
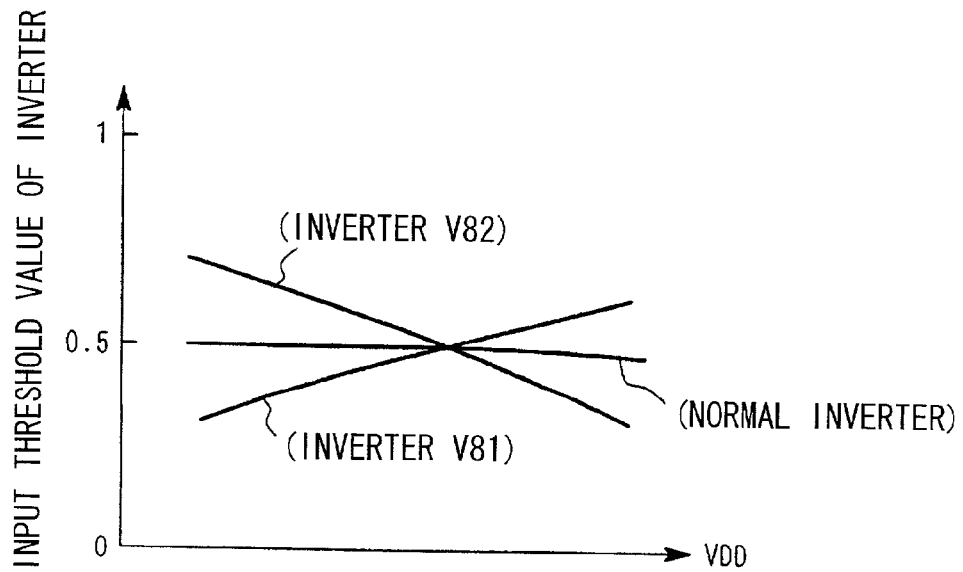
FIG. 8B is a characteristic graph of the inverters used in the circuit shown in FIG. 8A.

According to the delay circuit in Embodiment 8, as shown in FIG. 8B, using the standard input threshold value (0.5 V in this example) as reference, the input threshold value of the inverter V81 exhibits a decreasing tendency as the source voltage drops, and conversely, the input threshold value of the inverter V82 exhibits an increasing tendency as the source voltage drops. Accordingly, in the region of low source voltage, the input threshold in the delay circuit decreases and the delay time of a high level logic signal SIN becomes shorter relative to the delay time of a low level signal. The result is that the delay time of high level logic signal can be delayed, within a range of possible delay times, and the source-voltage dependency of the delay time can be contained.

Figure 9:
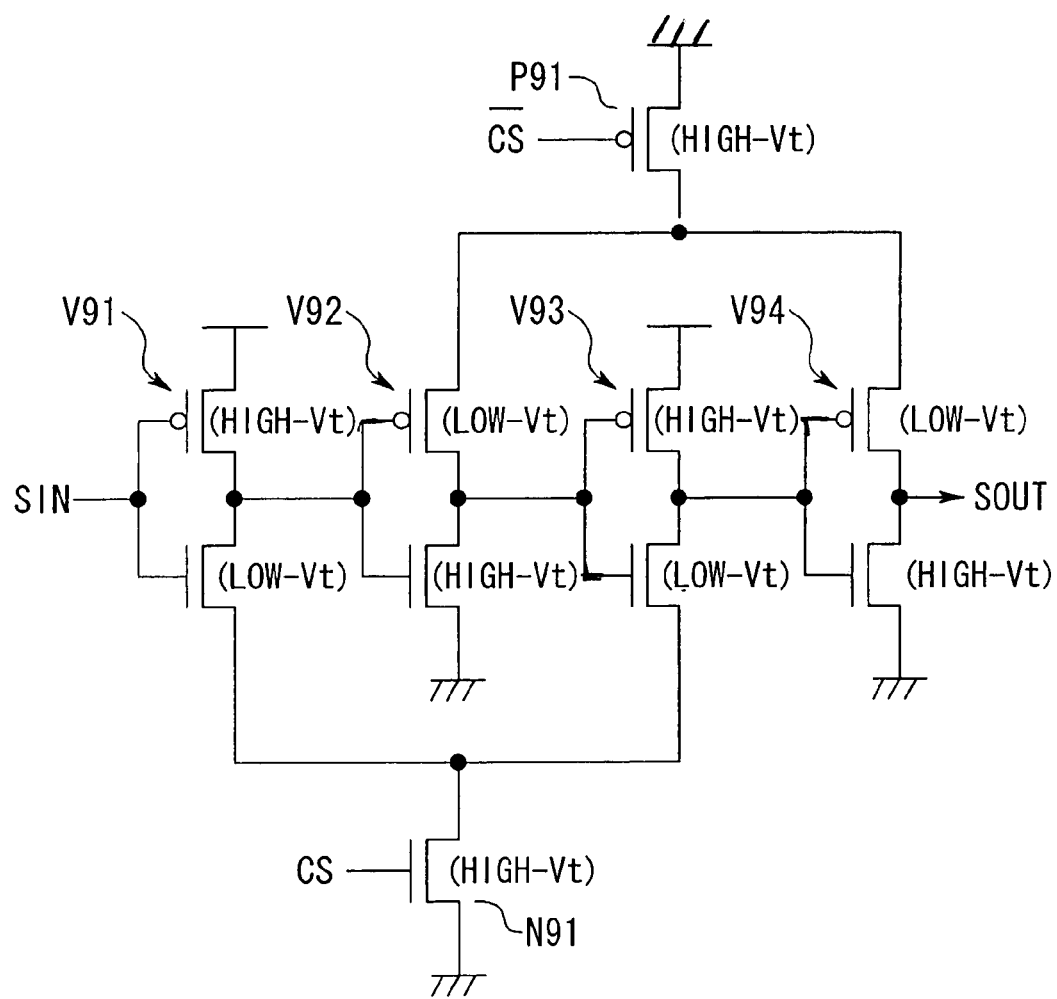
FIG. 9 is a circuit diagram to show the structure of a variation of the delay circuit in Embodiment 8 of the present invention.

FIG. 9 shows a variation of the delay circuit in Embodiment 8.

In the example shown in the diagram, a chip select signal, for controlling the active state or standby state of a semiconductor apparatus, is used to cutoff leak current of a low-Vt MOS transistor in the standby state.

That is, in the diagram, the source for a low-Vt n-MOS transistor comprising an inverter V91 and the source of the low-Vt n-MOS transistor comprising an inverter V93 are connected to the ground by way of a high-Vt n-MOS transistor N91. Also, the source for a low-Vt p-MOS transistor comprising an inverter V92 and the source of the low-Vt p-MOS transistor comprising an inverter V94 are connected to the ground by way of a high-Vt p-MOS transistor P91.

According to this variation, when the logic signal SIN is fixed at the low level during the standby state, n-MOS transistor N91 and p-MOS transistor P91 are set to the off-state by means of the chip select signal CS,/CS. In this case, although each of the n-MOS transistors comprising the inverter V91, V93 become off-state, these are low-Vt transistors and are susceptible to generating leak current. However, even if leak current is generated in the low-Vt n-MOS transistors, the high-Vt n-MOS transistor N91 is in the off state so that the generation of leak current is suppressed. Similarly, during the standby state, even if leak current is generated in the low-Vt p-MOS transistors comprising the inverter V92, V94, leak current is suppressed by the high-Vt p-MOS transistor P91.

Therefore, according to the first variation, source-voltage dependency is contained and it enables to effectively control power consumption during the standby state.

This variation example suppresses source-voltage dependency of the delay time by adjusting the input threshold value of each converter, but as in the example shown in Embodiment 1, MOS capacitors may be used to suppress source-voltage dependency of delay time.

Figure 10:
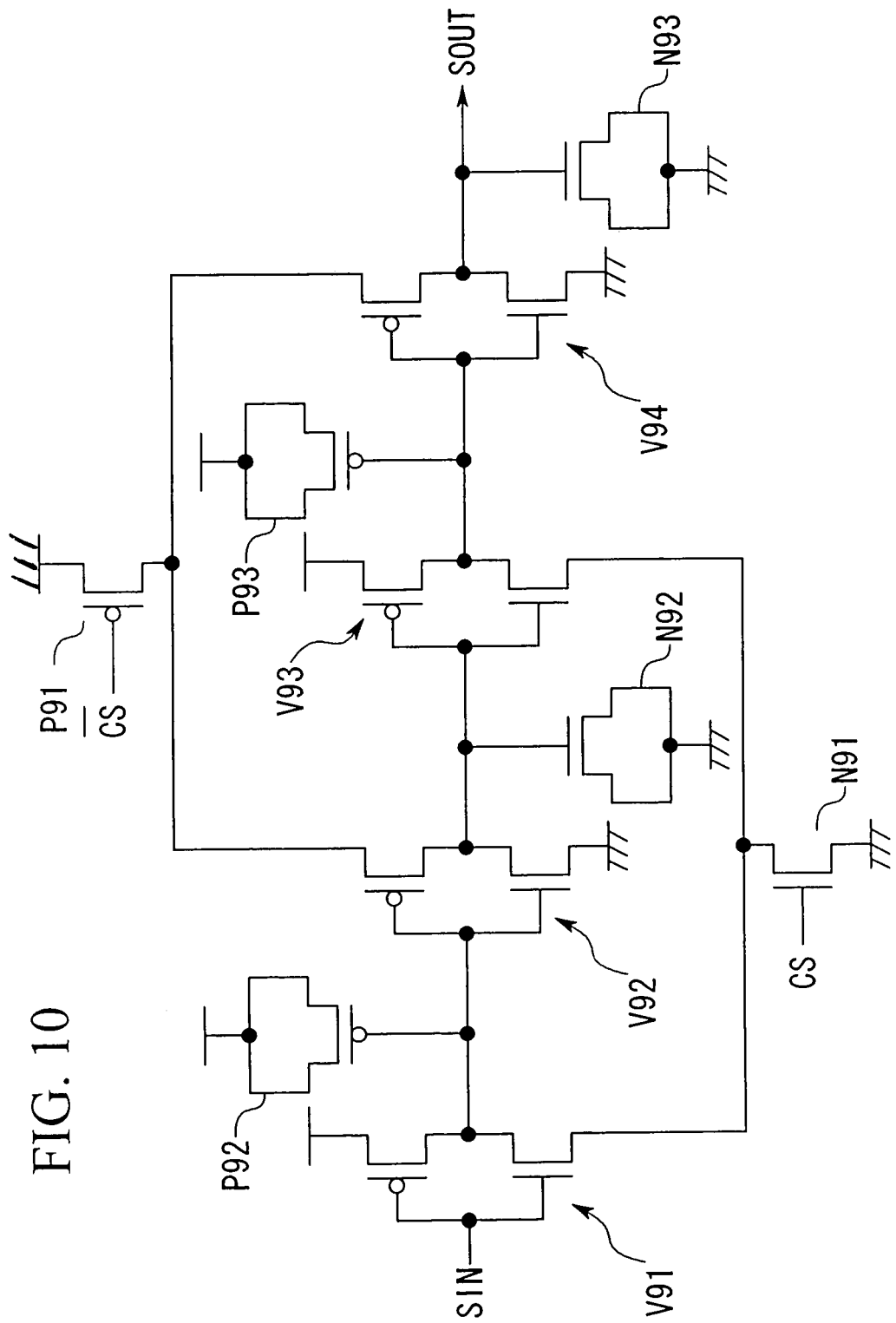
FIG. 10 is a circuit diagram to show the structure of another variation of the delay circuit in Embodiment 8 of the present invention.

FIG. 10 shows an example of the structure of the variation shown in FIG. 9 based on the use of MOS capacitors. In this example, MOS capacitors comprised by p-MOS transistors P92, P93 and n-MOS transistor N92, N93 are further added to the structure used in the above variation. However, the input threshold values of the inverters V91~V94 are set to standard values.

Embodiment 9

Embodiment 9 will be explained in the following.

The pulse generation circuit in Embodiment 6 is constructed using the delay circuit shown in Embodiment 1, but in Embodiment 9, in addition to the delay circuit of this type, low-Vt transistors are used to construct a pulse generation circuit that does not produce voltage-dependent pulse width and can operate at high speeds.

Figure 11:
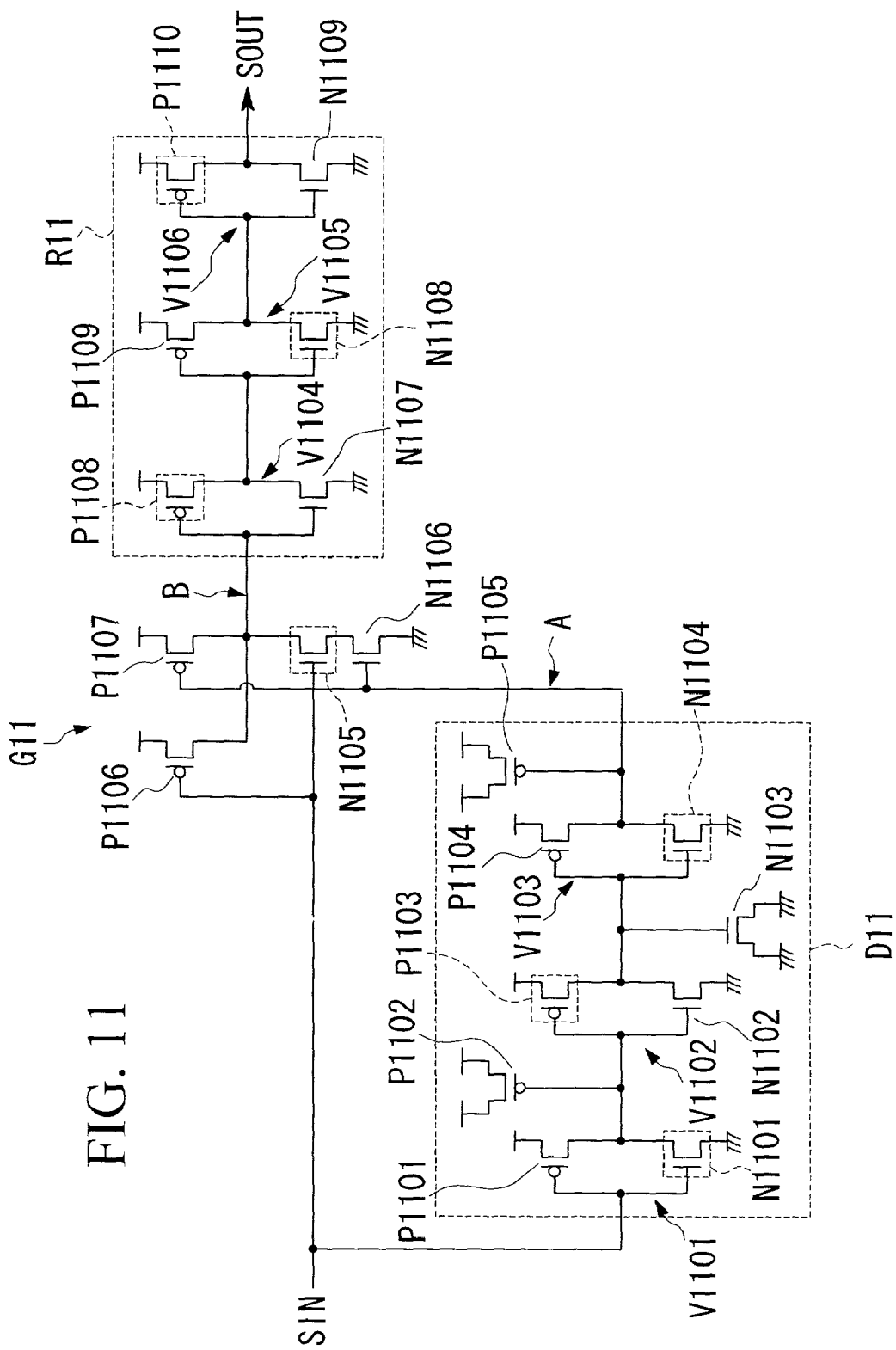
FIG. 11 is a diagram to show the operation of a pulse generation circuit in Embodiment 9 of the present invention.

FIG. 11 shows the structure of the pulse generation circuit in Embodiment 9. The pulse generation circuit is comprised by a delay circuit D11; a NAND circuit G11; and a logic circuit R11. The delay circuit D11 is constructed in the same way as the delay circuit shown in Embodiment 1, and is comprised by: an inverter V1101 comprised by a p-MOS transistor P1101 and an n-MOS transistor N1101; a MOS capacitor comprised by a p-MOS transistor P1102; an inverter V1102 comprised by a p-MOS transistor P1103 and an n-MOS transistor N1102; a MOS capacitor comprised by an n-MOS transistor N1103; an inverter V1103 comprised by a p-MOS transistor P1104 and an n-MOS transistor N1104; and a MOS capacitor comprised by a p-MOS transistor P1105.

Here, an input signal SIN is input in the input section of the inverter V1101. The gate of the p-MOS transistor P1102 is connected to the output section of the inverter V1101, and the source and drain are connected to the power source. Also, the input section of the inverter 1102 is connected to the output section of the inverter 1101 described above. The gate of the n-MOS transistor N1103 is connected to the output section of the inverter V1102, and the source and drain are grounded. Further, the input section of the inverter V1103 is connected to the output section of the inverter V1102. The gate of the p-MOS transistor P1105 is connected to the output section of the inverter V1103, and the source and drain are connected to the power source.

The NAND-gate G11 is comprised by: p-MOS transistors P1106, P1107 connected in parallel between the output node B and the power source; n-MOS transistors N1105, N1106 connected in series between the output node B and the ground. An input signal SIN is input in the gate terminals of the p-MOS transistor P1106 and the n-MOS transistor N1105, and an output signal from the delay circuit D11 is input in the gate terminals of the p-MOS transistor P1107 and the n-MOS transistor N1106.

The logic circuit R11 is comprised by a 3-stage inverter chain containing inverters V1104, V1105 and V1106. Here, the inverter V1104 is comprised by a p-MOS transistor P1108 and an n-MOS transistor N1107; the inverter V1105 is comprised by a p-MOS transistor P1109 and an n-MOS transistor N1108; and the inverter V1106 is comprised by a p-MOS transistor P1110 and an n-MOS transistor N1109. This logic circuit R11 represents a circuit to control the output state of the pulses generated in the pulse generation circuit, and is not limited to the inverter chain.

In the structure of the pulse generation circuit described above, the gate threshold voltages Vt of the n-MOS transistors N1101, N1104, N1105, N1108 and the p-MOS transistors P1103, P1108, P1110 are set low, and the gate threshold voltages of other transistors are set to the standard value.

In the following, the operation of the pulse generation circuit in Embodiment 9 will be explained with reference to the waveforms shown in FIG. 12. First, prior to time t01, the input signal SIN is at the low level. In this state, the high level appears at the output node A of the delay circuit D11, and the high level appears also in the output node B of the NAND-gate G11 while the output signal SOUT is at the low level. When the input signal SIN changes to the high level at time t01, the n-MOS transistor N1105 receiving the input signal SIN in the gate becomes on-state.

At this instant, the change in the input signal SIN has not yet appeared at the output node A, so that the high level is being maintained and the n-MOS transistor N1106 is in the on-state. Therefore, the output node B of the NAND-gate G11 is driven to the low level through the n-MOS transistors N1105, 1106. The logic circuit R11 receives the low level appearing in the output node B, and the high level is output as the output signal SOUT after an interval tS elapses from time t01.

Next, after a delay time given by the delay circuit D11 has elapsed from time t01, the delay circuit D11 outputs the low level to the output node A. The NAND-gate G11 receiving this low level outputs the high level to the output node B. The logic circuit R11 receiving this high level outputs the low level as the output signal SOUT after an interval tE elapses from time t02.

Here, the time interval between an event of output signal becoming high level and an event of reverting to low level is given by a sum of the delay times given in the delay circuit D11, in the NAND-gate G11 and in the logic circuit R11, but the delay times in the NAND-gate G11 and the logic circuit R11 are kept sufficient low compared with the delay time in the delay circuit D11. By so doing, by having the input signal SIN change to the high level at time t01, it is possible to output an output signal SOUT having a pulse width corresponding to the delay time of the delay circuit D11.

It should be noted that, according to the pulse generation circuit, when the input signal SIN changes to the high level, the low-Vt n-MOS transistor N1105, the low-Vt p-MOS transistor P1108, the low-Vt n-MOS transistor N1108, and the low-Vt p-MOS transistor P1110 successively change to the on-state and the output signal SOUT is output at the high level. Therefore, the time interval tS is shortened so that the output signal SOUT can be produced quickly. Further, because the pulse width of the output signal SOUT is governed by the delay time produced in the delay circuit D11 having mild voltage-dependency, it is possible to reduce the voltage-dependency of the pulse width.

Figure 12:
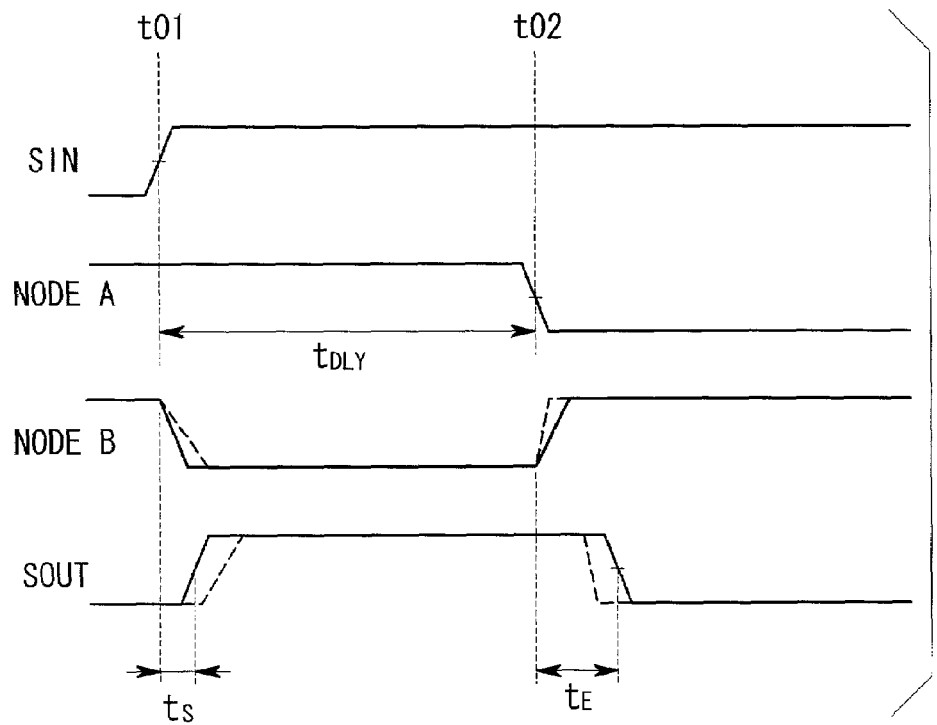
FIG. 12 is a waveform diagram to explain the operation of the pulse generation circuit in Embodiment 9 of the present invention.

In FIG. 12, the waveforms are shown, as reference, in order to illustrate the characteristics of the waveforms produced when all the gate threshold voltages of the transistors are set to the standard value in the delay circuit structure shown in FIG. 11. In such a case, the time for the output signal SOUT to attain the high level is delayed so that the merit of speedy response is lost. Also, because the delay time in the logic circuit R11 increases, the pulse width tends to become more sensitive to the source-voltage. Therefore, high speed as well as stability are enabled by combining the low-Vt transistors as shown in FIG. 11.

Figure 13:
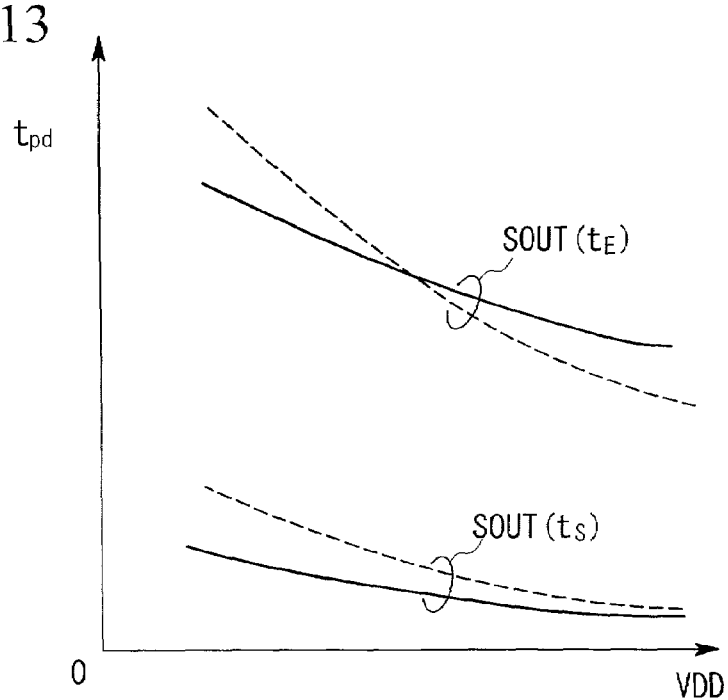
FIG. 13 is a characteristic diagram to explain the source-voltage dependency of the pulse generation circuit in Embodiment 9 of the present invention.

FIG. 13 shows the voltage-dependent behavior of the delay interval tpd (tS, tE) in the pulse generation circuit. In the graph, the solid lines show the case of using low-Vt transistors, and the dotted lines show the case of using only standard-Vt transistors. As can be understood from the graph, for either time interval tS or tE, the slopes of the characteristic curves produced by low-Vt transistors are milder, indicating that the voltage-dependency has been decreased. Furthermore, when low-Vt transistors are used, the time interval tS between the events of change of input signal SIN and change of output signal SOUT has been reduced even more to indicate that the output signal is generated at high speed.

Embodiment 10

Embodiment 10 will be explained in the following.

In Embodiment 9 described above, the pulse generation circuit was constructed so that a pulse signal is generated when an input signal SIN changes to the high level, but in Embodiment 10, a timing adjustment circuit is provided such that, when an input signal SIN is input at the high level, the timing adjustment circuit delays this input signal SIN to adjust the pulse generation timing.

Figure 14:
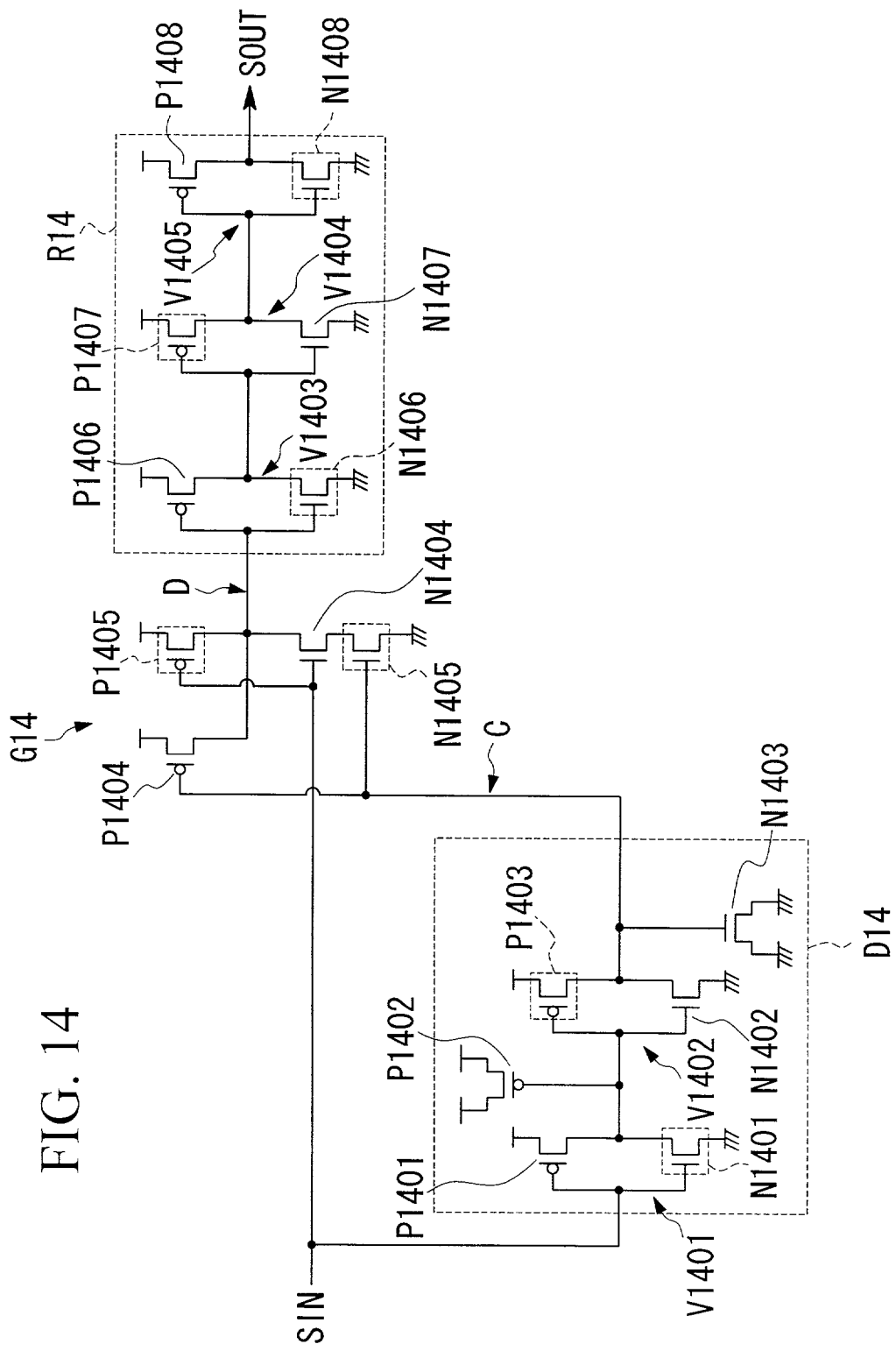
FIG. 14 is a circuit diagram to show the structure of a timing adjustment circuit in Embodiment 10 of the present invention.

FIG. 14 shows the structure of the timing adjustment circuit in Embodiment 10. The timing adjustment circuit is comprised by: a delay circuit D14; a NAND-gate G14; and an AND-gate R14. The delay circuit D14 is comprised by: an inverter V1401 comprised by a p-MOS transistor P1401 and an n-MOS transistor N1401; a MOS capacitor comprised by a p-MOS transistor P1402; an inverter V1402 comprised by a p-MOS transistor P1403 and an n-MOS transistor N1402; and a MOS capacitor comprised by an n-MOS transistor N1403. These components are connected in the same manner as in the delay circuit D11 described in Embodiment 9.

The NAND-gate G14 is comprised by: a p-MOS transistors P1404, P1405 connected in parallel between the output node D and the power source; and n-MOS transistors N1404, N1405 connected in series between the output node D and the ground. An input signal SIN is input in the gate terminals of the p-MOS transistor P1405 and the n-MOS transistor N1404, and an output signal from the delay circuit D14 is input in the gate terminals of the p-MOS transistor P1404 and the n-MOS transistor N1405.

The logic circuit R14 is comprised by a 3-stage inverter chain containing inverters V1403, V1404 and V1405. Here, the inverter V1403 is comprised by a p-MOS transistor P1406 and an n-MOS transistor N1406; the inverter V1404 is comprised by a p-MOS transistor P1407 and an n-MOS transistor N1407; and the inverter V1405 is comprised by a p-MOS transistor P1408 and an n-MOS transistor N1408. This Logic circuit R14, similar to the Logic circuit R11 described in Embodiment 9, represents a circuit to control the output state of the pulses generated in the pulse generation circuit, and is not limited to the inverter chain. Also, in the structure of the timing adjustment circuit described above, the gate threshold voltages Vt of the n-MOS transistors N1401, N1405, N1406, N1408 and the p-MOS transistors P1403, P1405, P1407 are set low, and the gate threshold voltages of other transistors are set to the standard value.

In the following, the operation of the timing adjustment circuit in Embodiment 10 will be explained with reference to the waveforms shown in FIG. 15.

Prior to time t11, the input signal SIN is at the high level. In this state, the high level appears at the output node C of the delay circuit D14, and the low level appears in the output node D of the NAND-gate G14, and the output signal SOUT is at the high level. When the input signal SIN changes to the low level at time t11, the p-MOS transistor P1405 receiving the input signal SIN in the gate becomes on-state, and the high level appears in the output node D. The Logic circuit R14 receiving this high level outputs a low level signal SOUT after a time interval tS elapses from time t11.

Next, after a delay time given by the delay circuit D14 has elapsed from time t11, the delay circuit D14 outputs the low level to the output node C. The p-MOS transistor P1404 of the NAND-gate G14 receiving this low level signal becomes on-state, but because the p-MOS transistor P1404 is already in the on-state, the level of the output node is maintained at the high level. Therefore, even if a low level signal appears in the output node of the delay circuit D14, the output signal SOUT does not change.

Next, at time t12, when the input signal ISN changes to the high level, the n-MOS transistor N1404 receiving this signal in the gate becomes on-state. However, because the low level signal is appearing in the output node C of the delay circuit D14 at this time, the n-MOS transistor N1405 receiving this signal in the gate is in the off-state. Therefore, the output node D maintains the high level.

Next, after a delay time given by the delay circuit D14 has elapsed from time t12, the delay circuit D14 outputs the high level to the output node C. The n-MOS transistor N1405 receiving this high level in the gate becomes on-state. At this time, because the n-MOS transistor N1404 is already in the on-state, the output node D is driven to the low level through the n-MOS transistors N1404, N1405. The Logic circuit R14 receiving this low level signal outputs it as the signal SOUT after a time interval tE elapses from the time t12.

Here, the time interval between an event of input signal SIN changing to the high level and an event of output signal SOUT changing to the high level, is given by a sum of the delay times given in the delay circuit D11, in the NAND-gate G14 and in the Logic circuit R14, but the delay times in the NAND-gate G14 and the Logic circuit R14 are kept sufficient low compared with the delay time in the delay circuit D14. By so doing, the time interval tE between an event of input signal SIN changing to the high level at time t12 to an even of output signal SOUT changing to the high level, is governed by the delay time in the delay circuit D14, which has low dependence on the source voltage. Therefore, the source-voltage dependency of time interval tE is decreased.

Also, when the input signal SIN changes to the low level at time t11, the low-Vt p-MOS transistor P1405, the low-Vt n-MOS transistor N1406, the low-Vt p-MOS transistor P1407, and the low-Vt n-MOS transistor N1408 successively change to the on-state, and the output signal SOUT is output at the low level. Therefore, the time interval tS is shortened so that the output signal SOUT can be produced quickly.

Figure 15:
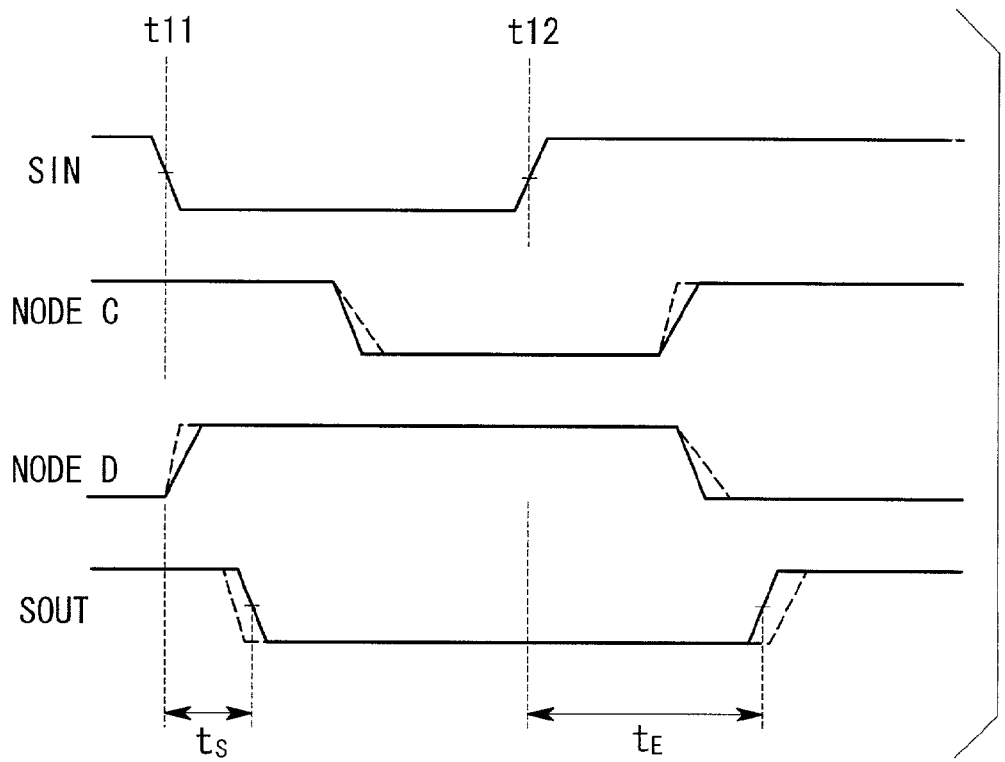
FIG. 15 is a waveform diagram to explain the operation of the timing adjustment circuit in Embodiment 10 of the present invention.
Figure 16:
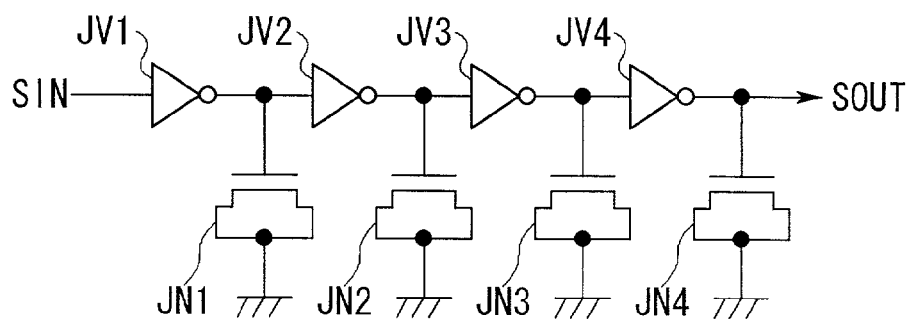
FIG. 16 is a circuit diagram to show an example of the structure of the delay circuit according to the conventional technology.
Figure 17:
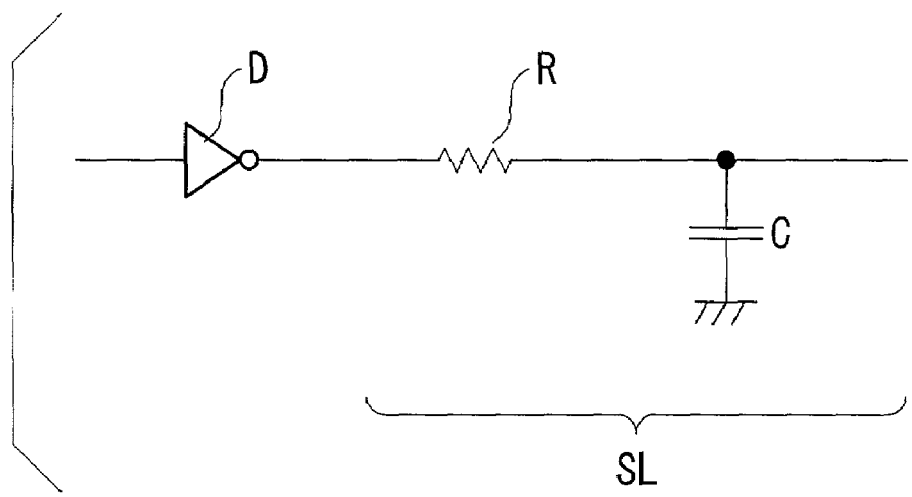
FIG. 17 is a circuit diagram to show an example of the logic circuitry provided in a semiconductor apparatus along with the delay circuit.
Figure 18:
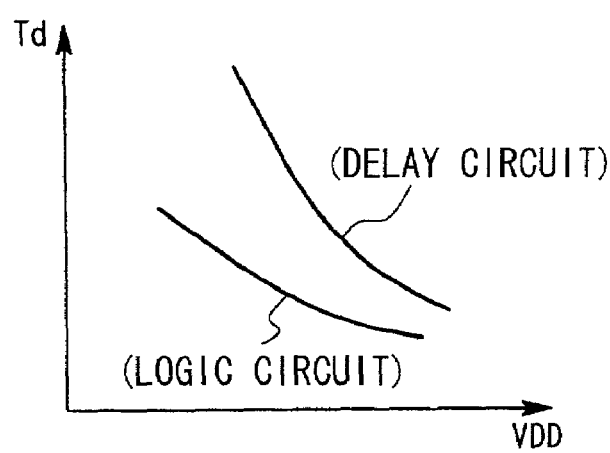
FIG. 18 is a characteristic diagram to explain the difference in source-voltage dependency behaviors of the delay circuit and the logic circuit.

Also, in FIG. 15, the waveforms shown by dotted lines illustrate the case of setting the gate threshold voltages of all the transistors to the standard value in the circuit structure shown in FIG. 14. In this case, the time interval tS of the output signal SOUT changing to the low level is increased, and the speed is lost. Also, because the delay time in the delay circuit R14 increases, the source-voltage dependency of the pulse width shows a tendency to increase. Therefore, speed as well as stability can be secured by combining low-Vt transistors as shown in FIG. 14.

Although the present invention has been explained above using various embodiments, the present invention is not limited to those embodied examples, and includes those design changes and the like that fall within the essence of the present invention.

For example, in Embodiment 9, a pulse is generated with an input signal SIN changes to the high level, but the circuit may be arranged so that a pulse is generated when the input signal changes to the low level.

Also, in Embodiment 10, an input signal is delayed when the input signal changes to the high level, but delay may be effected when the signal changes to the low level.

Further, a gating circuit may be provided to degrade output signals from the delay circuit so as to produce a design that inactivates the circuit during the standby period.

What is claimed is:

1. A delay circuit for delaying a logic signal having two logic levels consisting of a low level and a high level, comprising:
    an inverter chain containing not less than four inverters;
    a p-channel metal-oxide-semiconductor transistor and an n-channel metal-oxide-semiconductor transistor, known as MOS transistors, to comprise each of the at least four inverters, wherein a gate threshold voltage of each gate of said p-MOS and n-MOS transistors is shifted in mutually opposing directions;
    low threshold voltage n-MOS transistors of each of a first and a third inverter connected to ground by a high threshold voltage n-MOS transistor; and
    low threshold voltage p-MOS transistors of each of a second and a fourth inverter connected to a power source line by a high threshold voltage p-MOS transistor;
    wherein, when an input logic signal is fixed at a low level during a standby state, said high threshold voltage n-MOS transistor is set to an off-state in response to a chip select signal controlling said standby state, and said high threshold voltage p-MOS transistor is set to an off-state in response to said chip select signal that is negated.

2. A delay circuit, comprising:
    first, second and third nodes;
    a first inverter, the output of which coupled to said first node, and first inverter receiving a logic signal;
    a second inverter, the input of which coupled to said first node and the output of which coupled to said second node;
    a third inverter, the input of which coupled to said second node and the output of which coupled to said third node;
    a fourth inverter, the input of which coupled to said third node,
    wherein at least one of said inverters includes a pair of transistors, a gate threshold voltage of each gate of said pair of transistors being shifted in mutually opposing directions;
    a first capacitor having two electrodes, one of said electrodes connecting to a first power source line and the other connecting with a wiring layer having both ends to said first node, said wiring layer having no connection with a circuit at any points thereon between said both ends, said first capacitor being a first transistor of a first channel type;
    a second capacitor coupled between said third node and said first power source line, said second capacitor being a second transistor of said first channel type; and
    wherein no capacitor is connected to said second node.

3. A delay circuit according to claim 2, wherein said first transistor and said second transistor are p-MOS transistors, and said first power source line is fixed at a power potential.

4. A delay circuit according to claim 2, wherein said first transistor and said second transistor are n-MOS transistors, and said first power source line is fixed at a ground potential.

5. A delay circuit, comprising:
2n+1 nodes defined in series, n being a natural number, a first node receiving a logical signal;
2n inverters, each inverter arranged between adjacent nodes of said 2n+1 nodes, wherein at least one of said inverters includes a pair of transistors, a gate threshold voltage of each gate of said pair of transistors being shifted in mutually opposing directions;
a capacitor of an n-MOS type coupled between an even node and a power source line; and
a NOR gate coupled to the first node and the (2n+1)th node.

6. A delay circuit receiving a logic signal having a first logical level and a second logical level, comprising:
a first inverter chain including a plurality of inverters and at least one first capacitor, said first inverter chain receiving said logic signal and said first capacitor including a MOS transistor of a first channel type,
wherein said first capacitor changes from an off-state to an on-state to increase capacitance thereof when said logic signal changes from said first logical level to said second logical level, whereby said first inverter chain outputs a first delay signal generated after a first delay time from a transition timing from said first to said second logical levels of said logic signal, and
wherein said first capacitor changes from said on-state to said off-state to decrease capacitance thereof when said logic signal changes from said second logical level to said first logical level, whereby said first inverter chain outputs a second delay signal generated after a second delay time from a transition timing from said second to said first logical levels of said logic signal, said second delay time being shorter than said first delay time;
a first logical gate receiving the output of said first inverter chain and said logic signal;
a second inverter chain including a plurality of inverters and at least one second capacitor, said inverter chain receiving the output of said first logical gate;
a second logical gate receiving the output of said first logical gate and the output of said second inverter chain; and
a third logical gate receiving said logic signal and the output of said second logical gate,
wherein at least one inverter in said first and second inverter chains includes a pair of transistors, a gate threshold voltage of each gate of said pair of transistors being shifted in mutually opposing directions, and wherein said first inverter chain and said second inverter chain have the same structure.

* * * * *